United States Patent [19]

Dixit et al.

[11] Patent Number: 5,068,723
[45] Date of Patent: Nov. 26, 1991

[54] FRAME OR SUB-FRAME RATE ADAPTIVE VECTOR QUANTIZER FOR MOVING IMAGES

[75] Inventors: Sudhir S. Dixit, Norwood; Yushu Feng, Worcester, both of Mass.

[73] Assignee: GTE Laboratories Incorporated, Waltham, Mass.

[21] Appl. No.: 557,268

[22] Filed: Jul. 24, 1990

Related U.S. Application Data

[63] Continuation-in-part of Ser. No. 354,007, May 19, 1989, abandoned.

[51] Int. Cl.⁵ .......................... H04N 7/12; H04N 7/18
[52] U.S. Cl. ..................................... 358/133; 358/135; 358/105; 375/122
[58] Field of Search ............... 358/133, 135, 136, 105; 375/122

[56] References Cited

U.S. PATENT DOCUMENTS

| | | | |
|---|---|---|---|
| 4,558,350 | 12/1985 | Murakami | 358/21 R |
| 4,710,812 | 12/1987 | Murakami | 358/136 |
| 4,780,761 | 10/1988 | Daly et al. | 358/133 |
| 4,791,654 | 12/1988 | De Marca et al. | 375/122 |
| 4,797,739 | 1/1989 | Tanaka | 358/133 |
| 4,845,559 | 7/1989 | Labit et al. | 375/122 |
| 4,853,779 | 8/1989 | Hammer et al. | 358/135 |

OTHER PUBLICATIONS

Adaptive Vector Quantization of Video for Packet Switched Networks, Dixit, S. S. and Feng, Yushu, to be published in Proceedings of IEEE 1989 Int. Conf. on Acoustics, Speech and Signal Processing, Glasgow, May 23, 1989.

Primary Examiner—John K. Peng
Attorney, Agent, or Firm—Victor F. Lohmann, III

[57] ABSTRACT

An adaptive vector quantization scheme suitable for packet video adapts to the varying characteristics of the actual images sequence being compressed. A large code book is divided into two sections, having higher and lower priority, representing common characteristics and specific characteristics of images. Each new image to be coded is first compared to the common characteristics section of the code book. If a match of acceptable quality is not found, then it is compared to the specific characteristics section. The best match of the two sections is utilized. Entries in the two sections are reorganized and/or exchanged as a function of the usage of the code vectors therein. The rate and extent of adaptation is dictated by the update interval and the desired level of quality, respectively, without requiring any transmission of the vectors themselves or the side information.

9 Claims, 3 Drawing Sheets

FRAME OR SUB-FRAME RATE ADAPTIVE VECTOR QUANTIZER FOR MOVING IMAGES

CROSS-REFERENCE TO RELATED APPLICATIONS

This is a continuation-in-part of copending application Ser. No. 07/354,007 filed on May 19, 1989 by the same inventor as this CIP application, now abandoned.

BACKGROUND OF THE INVENTION

This invention pertains to the encoding of video sequences for transmission over packet-switched networks (PSNs). In particular, it pertains to the compression and reconstruction of image signals using a new adaptive vector quantization (VQ) scheme suitable for packet video.

Vector quantization has been applied to speech coding for a number of years. However, the application of vector quantization to image coding is relatively new. Vector quantization has been applied both in the spatial and transformed domain in various forms. In its basic form, as illustrated in the block diagram of FIG. 1, an image is divided into blocks of N×N picture elements (pixels), reference number 31 in FIG. 3 In the transmitter and receiver identical code books 15 exist whose entries contain combinations of pixels in a block 31. Assuming that there are M shades of gray in an image, theoretically, $(M)^{N \times N}$ combinations are possible. In practice, however, there are only a limited number of combinations that occur most often, which reduces the size of the code table or code book considerably. The code book is created by training it over a large set of test images of different types. During the coding process, each block of the actual image 10, being compressed is compared 12 with entries 14 in the code book 15, and the address of that entry, which best matches, using the nearest neighbor rule, the image being compressed or encoded is transmitted 16 to the receiver. On the receive side, the received address is used to fetch 17 the same block 14 from the code book 15, which is then used to reconstruct the image 19. Typical block 14 and code book 15 sizes that are used are 4×4 and 256, respectively. Since it takes 8 bits to address an entry in the code book, a compression factor of 16 or bit rate of 0.5 bit per pixel is achieved, assuming that the original image is made up of 256 shades of gray. U.S. Pat. No. 4,797,739 issued to Tanaka is representative of the prior art.

Two major problems of vector quantization are: how to design a good code book that is representative of all the possible occurrences of pixel combinations in a block, and how to find a best match in the code book during the coding process. Some researchers have suggested various clustering techniques to design good code books. Tree searched algorithms have been used to speed up the code vector search process. A good overview of vector quantization can be found in Gray, IEEE ASSP Magazine, Apr. 1984, pp. 4–29. This invention does not relate to either the code table design or the search process. Rather, it deals with how to design an adaptive vector quantization which does not require sending of any side information, resulting in higher compression.

Most work in vector quantization has concentrated on compressing still-frame images. Application of vector quantization to color video compression is very recent. Broadcast video or image sequence compression poses a rather different set of requirements, in addition to those required for still-images. For example, video images may vary significantly from frame-to-frame and from scene-to-scene, and standard vector quantization code books may not be able to deliver a constant level of quality over a period of time. Furthermore, because of high pixel rate of video, the complexity and processing speed of a codec become important considerations in an algorithm. It is almost essential that an algorithm be adaptive to guarantee a level of performance over a wide range of types of video sequences. Two approaches which can be used to improve image quality are to increase the size of the fixed code book, or to keep the code book small but update the code book entries during the coding process. The first approach adversely affects the bit rate and the vector search time. In the latter approach to making vector quantization adaptive, the code book is updated either on a block-by-block basis or frame-by-frame basis, or at some other regular interval, to adapt to the local characteristics of a frame or sequence being coded. Work of some researchers in this area is based on the above approach. The major drawback of the approach adapted so far is that all the suggested techniques require sending either a new code book altogether every so often, or the new code words to replace the ones already in the code book, and this implies sending the side information. Although, the image quality improves, it is at the expense of increasing the bit rate. In summary, the code book size remains small and constant, but its entries are changed as a function of time.

SUMMARY OF THE INVENTION

A principal object of this invention is to provide an adaptive vector quantization of video images for packet switched networks which can accommodate a variable bit rate, allow for selectable image quality and be immune to packet defects and losses.

It is a further object of this invention to provide an algorithm for vector quantization which can adapt to changing image characteristics from sequence-to-sequence and frame-to-frame.

It is still a further object of the invention to provide an adaptive vector quantization algorithm without adversely affecting the bit rate of transmissions or the vector search time at the point of reception.

These and other objects of the inventions are achieved in the adaptive vector quantization scheme of the present invention which is suitable for the specific requirements of packet video in that a large code book is divided into two sections, having higher and lower priority, respectively, representing common characteristics and specific characteristics of images. Entries in the two sections are reorganized and/or exchanged as a function of the usage of the code vectors therein. The rate and extent of adaptation is dictated by the update interval and the desired level of quality, respectively, without requiring any transmission of the vectors themselves.

In a first aspect of the invention, a method of compressing a sequence of image signals at a transmitter for transmission to a receiver and reconstructing said sequence of image signals at said receiver by adaptive vector quantization comprises a plurality of steps. The initial steps are constructing a code book having a plurality of addressable entries representing combinations of elements which have appeared frequently in previously coded images; dividing said code book into two sections, wherein a first of said sections contains addressable entries for common characteristics of a large plurality of images, and has a higher priority than a second section; wherein a second of said sections contains addressable entries for specific characteristics of a sequence of images, having less frequently occurring vectors and having a lower priority; said first section containing vectors having the highest probability of occurrence; storing copies of said code book such that they may be used for both compression and reconstruction of the same image signals; and each of said sections being initialized to predefined sizes and states at the beginning of each coding process. In a second sequence of steps, selecting a quality index which is a function of squared error distortion, representing the maximum acceptable distortion in a reconstructed image. In the third sequence of steps, dividing each newly arriving image into blocks having N×N picture elements; comparing each block of each newly arriving image in said sequence with entries in said first section of said code book to find a best match vector based on a distance measure; computing a first quality measure for said block; if said first quality measure is smaller or equal to said quality index, sending the address of said best matching vector to a receiver; if said first quality measure is larger than said quality index, searching for a best matching vector in said second section of said code book; computing a second quality measure for said matching vector in said second section; if said second quality measure is larger than said first quality measure, then sending the address of said best matched vector of said first section; else sending a special flag followed by the address of said best matched vector in said second section. The final sequence of steps comprises maintaining a record of frequency of usage of each vector in each section of said code book; incrementing usage records for matched vectors in said first and second sections; and periodically reordering said code book by swapping code vectors between said sections so that the most frequently used vectors appear in said first section.

In a second aspect of the invention, a sequence of steps for organizing the code book sections comprises assigning low addresses to said first section, higher addresses to said second section to minimize the number of bits transmitted and interchanging vectors from one section to the other depending on frequency of usage over a long term to minimize transient factors.

This approach follows a different reasoning than various approaches of the prior art. Simply stated, the new approach is: keep a large code book, part of which is addressable during normal coding, update the code vectors in the addressable part by vectors in the non-addressable part as a function of desired quality, and do so without sending any side information.

DESCRIPTION OF THE PREFERRED EMBODIMENT

This invention pertains to a vector quantization-based image compression technique which adapts to the varying characteristics of the actual image sequence (video) being compressed. The algorithm disclosed offers flexibility of image quality selection and bit-rate selection. The adaptive nature of the algorithm significantly increases video quality, robustness, and ease of implementation. The invention described herein is best suited for transmitting compressed video over packet switched networks. From here onward, moving images will be referred to as video.

Figure 1:
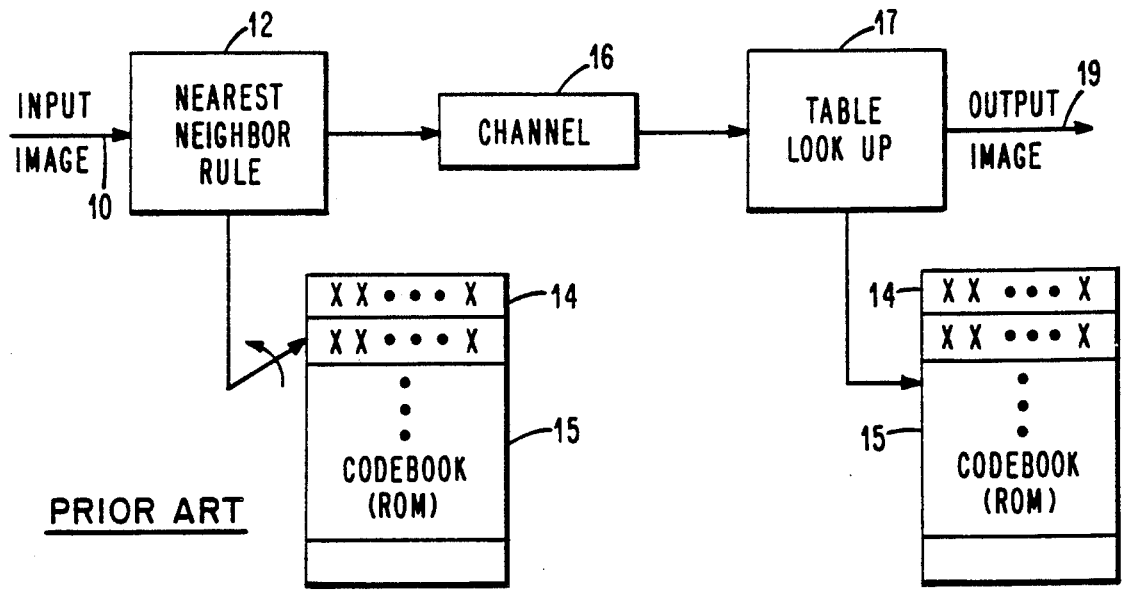
FIG. 1 is a block diagram of the vector quantization process of the prior art.
Figure 2:
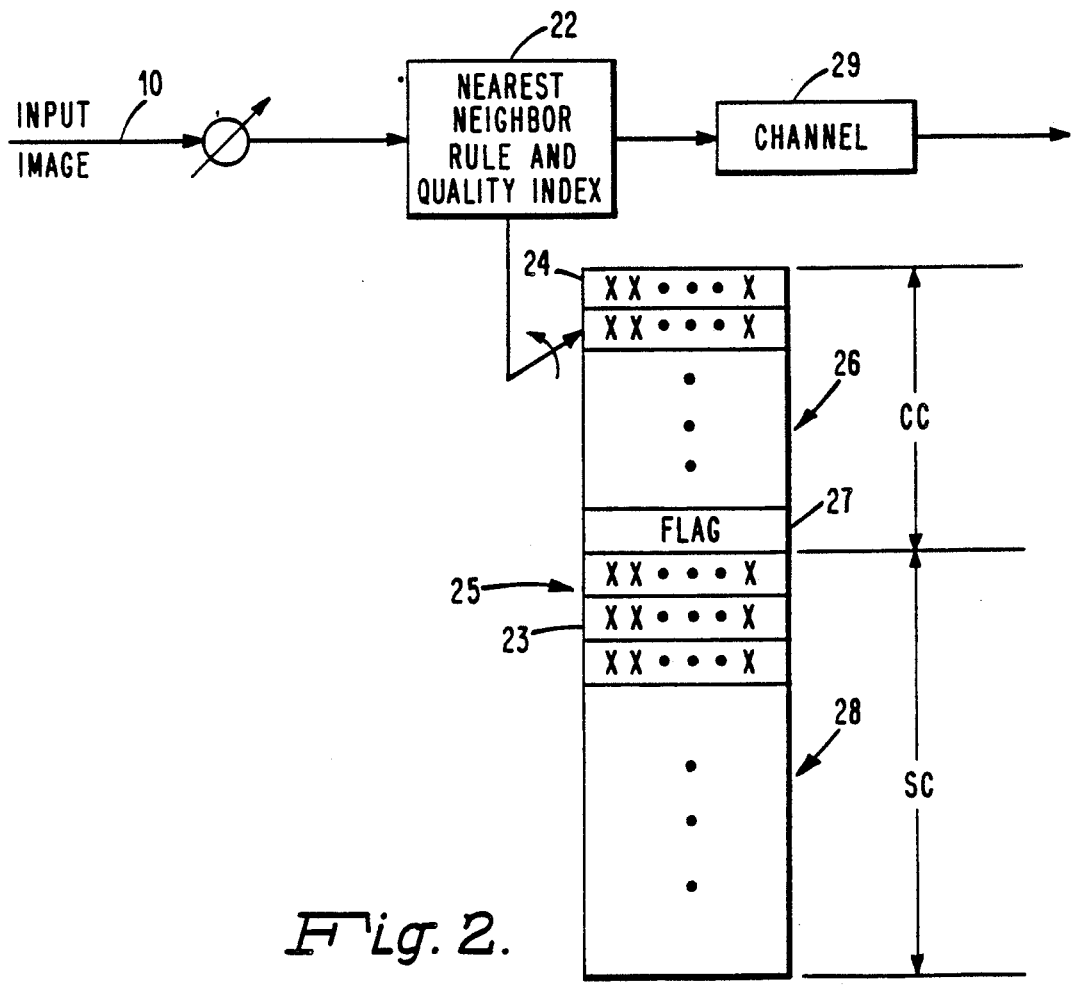
FIG. 2 is a block diagram of the adaptive vector quantization scheme of the present invention.

Our approach is a hybrid approach which relies on using a long, predesigned fixed code book which will enable coding of a wide variety of images and image sequences at an acceptable level of quality. FIG. 2 is a block diagram illustrating this approach. Since we assume that every image or sequence has two components of statistics, common characteristics of an ensemble of images and its own specific characteristics, we partition the long code book 25 into two sections: one to represent common characteristics (CC) 26, and the other to represent specific characteristics (SC) 28 of a sequence. The common section 26 of the code book 25 is assigned higher priority than the specific section, and the two are initialized to predefined sizes and states at the beginning of the coding process. Furthermore, the common section 26 contains vectors 24 which have the highest probability of occurrence. A quality index K, which is user selectable and is a function of squared error distortion, is set at the beginning 22 of the coding process:

$$K = f(D^2) = f\left( \sum_{i=1}^{N} (x_i - x_i')^2 \right)$$

where D is the Euclidean distance between two vectors or the distortion measure, N is the dimension of the vector, $x_i$ is the $i^{th}$ component of the actual image vector, and $x'_i$ is the $i^{th}$ component of a vector in the code table. The actual implementation of the invention described here used K=D.

During the coding process, when a new image vector 10 arrives, a best match of this new image vector, based on the distance measure 22, is found in the common part 26 of the code book 25, and the associated quality measure, $k_x$ is computed. If $k_x$ is smaller than or equal to the preset quality index K, ($k_x \leq K$), its address is sent via channel 29 to the receiver. However, if $k_x$ is larger than the quality index K, ($k_x > K$) a best match is found in the specific part 28 of the codebook, and its associated quality measure $k_{x'}$ is computed. But, if this new quality measure, $k_{x'}$, happens to be larger than the quality index $k_x$ ($k_{x'} > k_x$), we send the index of the best matched vector from the common section (CC) 26 of the code book; else, we send a special flag 27 followed by the address of the code vector 23 with the best match in the specific section 28 of the code book 25. We also maintain a set of counters (not shown) to store frequency of usage of each vector 23, 24 in the code book 25. To initialize these counters at the start of coding a video sequence, high count values are assigned to CC code vectors 24 from the common section 26 of the code book 25, and SC code vector 23 counters belonging to specific sections 28 of the code book 25 are cleared to zero. This is done to bias ordering of the vectors to common characteristics and to avoid changing these entries in response to transient characteristics of the sequence being encoded. During the coding process, however, the counters of those SC vectors 23 of the specific section 28 which are found to be the closest matches of the image vectors being coded are incremented. Sensitivity to the actual sequence being coded can be varied by weighting the step size of the vector usage counters of the two sections. At periodic intervals, which are a function of frame-rate, the code book 25 is reorganized in accordance with the frequency of usage of each code vector 23, 24, and the same is done in the receiver. In this process, a preset or variable number of code vectors are swapped between the two sections of the code book 25. Since the reordering is based on the information sent in the past, no side information is required to be sent. The ordering of the vectors in a section is of no significance. By introducing adaptivity, the algorithm disclosed herein puts high probability vectors, representing the characteristics of the actual sequence being encoded, in the active, (higher priority) common region of the code book.

The following explains the reorganization of the codebooks on a periodic basis in more detail. Prior to coding and transmittal of a new still-frame image or a video sequence, the predesigned CC and SC codetables are downloaded into temporary (changeable) codetables resident in a RAM (Random Access Memory). The image is then divided into blocks of N×N pixels. To code each block a best-matched codevector either in a CC or an SC codetable is found in accordance with the procedure described earlier, and its associated frequency counter is incremented. The index of the codevector is transmitted to the receiver. If the said codevector belonged to the SC codebook and the codebooks are updated after each block, the count of the said SC codevector is compared against all the counts associated with the codevectors in the CC codebook. If there is at least one CC codevector whose count is less than the said SC codevector count, the CC codevector with the lowest count is exchanged (along with their count values) with the said SC codevector, and the coding process is continued to the next block of pixels. However, if the desired update interval is different from above, e.g., after every 4th block or after each row of blocks or after each (or several) frames in the case of motion video, etc. some SC codevectors are exchanged with an equal number of CC codevectors. The SC codevector with the highest count in the SC section is exchanged with the CC codevector whose count is the lowest in the CC section but only if the CC codevector count is less than the SC codevector count, and this process is continued until no more exchanges can be made. Below is given an example to illustrate the procedure when the CC and SC codebook sizes are 8 and 16, respectively.

CC Codebook Counts    SC Codebook Counts

-continued

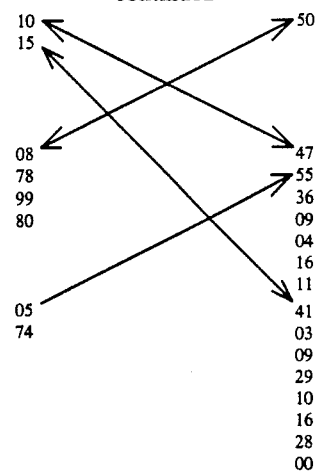

The actual values of the parameters (K, N, the codebook sizes, and the update interval) used in the experiments are detailed later in the section entitled Experimental Results.

Furthermore, the rate of adaptation and the percentage of vectors to be exchanged between the two sections of the large code book is controlled by changing the update interval and he quality index, respectively.

Algorithm

1) At the beginning of the image sequence, initialize the code book, by downloading it from the read only memory (ROM). Select a quality index K, block 22, which is the Euclidean distance in our implementation. Initialize all the counters associated with the codevectors 23 and 24 to zero.

2) Devise a new block of image pixels or a new vector from the frame being coded. Find its best match in the common characteristic (CC) section 26 of the code book 25. Assuming that this vector 24 is $x^c_i$, where i is the address (index) of the code vector 24, and the associated distortion measure is $D^c_i$, compute $k^c_i$. If $k^c_i < K$, send the address i, of the code vector 24 $x^c_i$, increment the counter associated with $x^c_i$ and go to 4); else, go to 3).

3) Find the best match of the incoming image vector in the specific characteristic (SC) section 28 of the code book 25. Assuming that this vector 23 is $x^s_j$, where j is the address (index) of the code vector 23, and the associated distortion measure is $D^s_j$, compute $k^s_j$. If $k^s_j > k^c_i$, send the address, i, of the code vector $x^c_i$, increment the counter associated with $x^c_i$, and go 4). Else, send a special flag 27, #, followed by the address j, of the code vector $x^s_j$, increment the counter of the code vector $x^s_j$ with a unit or weighted step-size, and go to 4.

4) Check it is time to update the code book 25. If not, go to 5). If yes, exchange those code vectors 23 in the specific characteristic section 28 which have higher count values with those code vectors 24 in common characteristic section 26 which have the least counts, and go to 5).

5) Is the complete frame processed? If yes, go to 6). If not, go to 2).

6) Is the complete sequence processed? If yes, return to main application, If not, go to 2).

Figure 4:
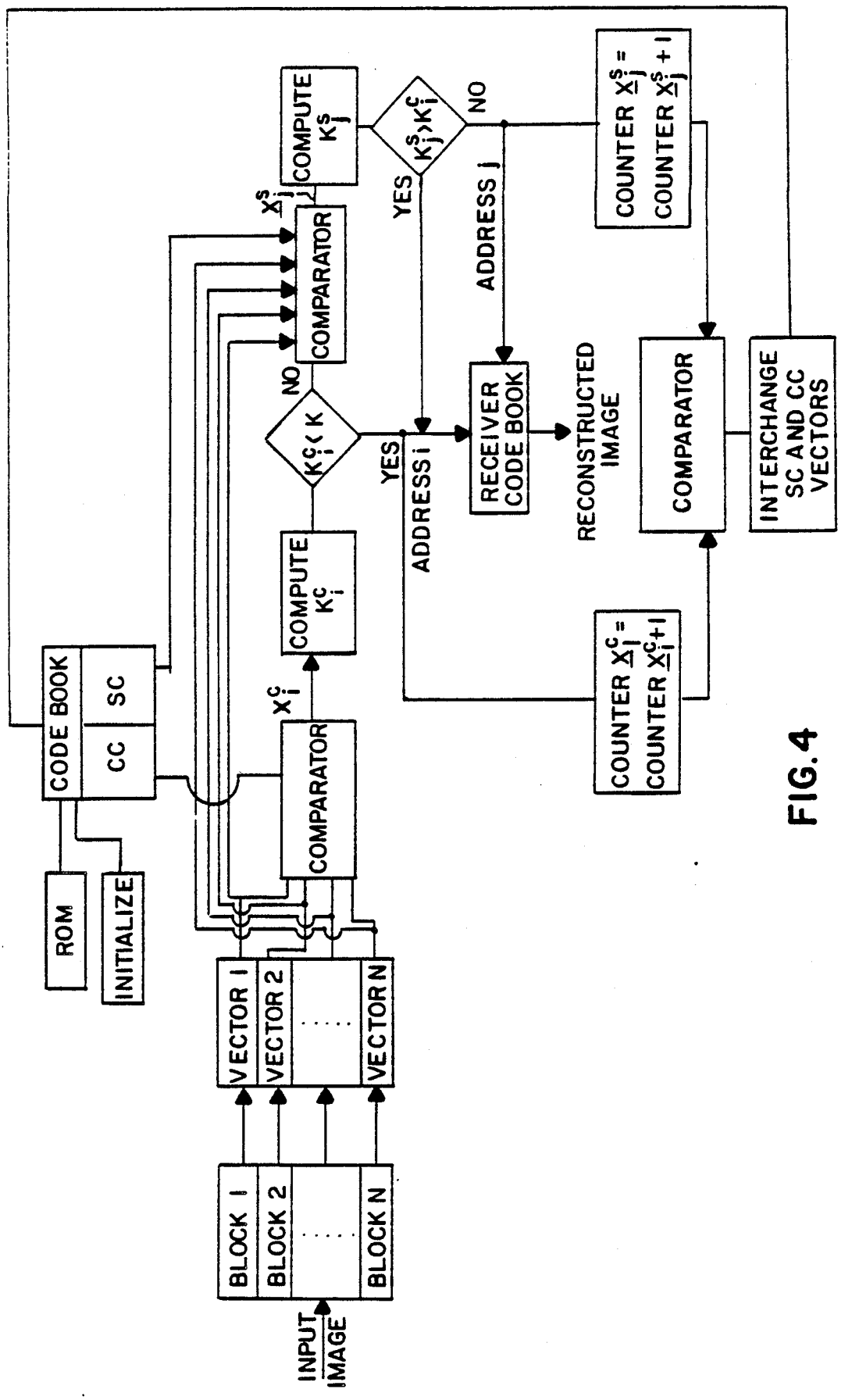
FIG. 4 is a block diagram further detailing the present invention as shown in FIG. 2.

A block diagram illustrating a system implementation of the above-identified algorithm is shown in FIG. 4.

The two sections of a large code book can be thought of as two independent code books of different sizes, one of small size, and the other one much larger with no duplication of code vectors in the two code books. Assuming that the quality index is the distance itself, i.e., K=D, the proposed algorithm offers the flexibility to use the code books in the desired mix simply by setting one parameter K. A small value of K implies a small acceptable 'D', and proportionally smaller number of acceptances of the vectors from the CC code book, and vice versa. Furthermore, the higher the desired image quality (implying smaller K and D), the higher the bit rate, and vice-versa. For example, if the CC code book size is 128 vectors (with one vector address reserved for the special flag) and the SC code book size is 2048 vectors, the compressed bit-stream would look like:

$$SSSSS\#@\#@S\#@SSSS$$

where $ is a 7-bit address of a vector in CC code book,
\# is a 7-bit special flag to signify that the following index is for SC code book, and
@ is an 11-bit address of a vector in SC code book.

In the proposed algorithm, the problem of providing high quality decoded images is solved by using a specific characteristic (SC) section of the code book, which is used only when necessary. Adaptivity to the type of image (or sequence) being coded is provided by exchanging vectors between the CC and SC code book sections at preset intervals. And the receiver code book is maintained in synchronism with the transmitter code book entries on a block-by-block basis by keeping track of code vector indicies and special flag code words.

Experimental Results

Figure 3:
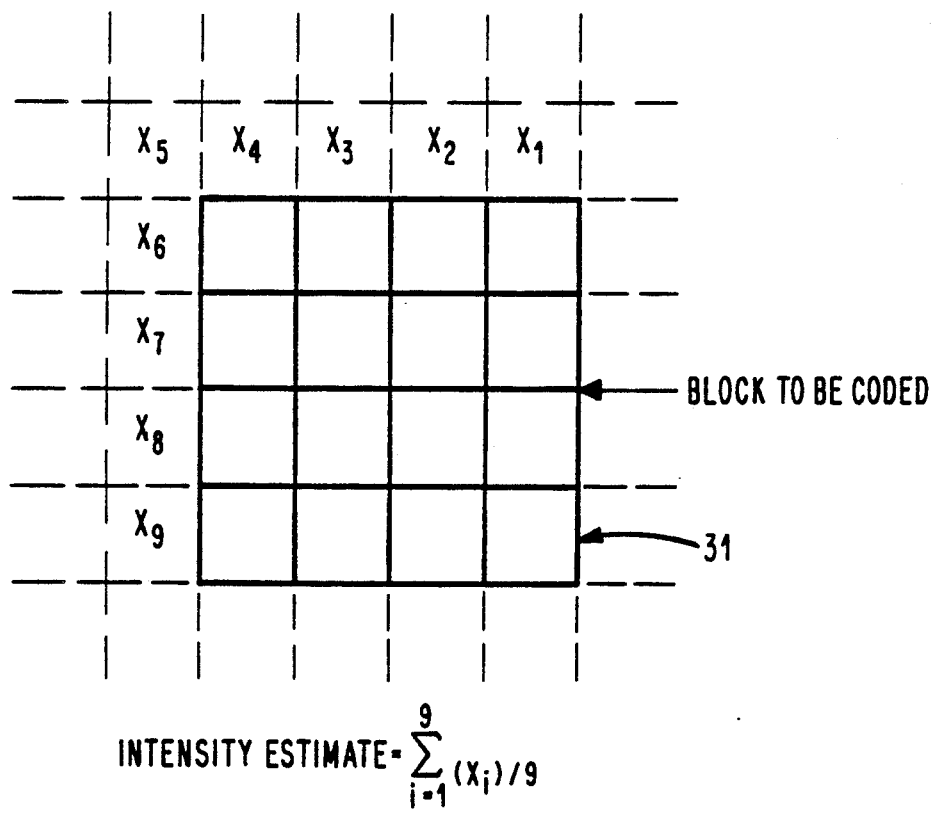
FIG. 3 is a diagram to illustrate the estimation of average intensity of a block to be coded according to the invention.

To evaluate the performance of the proposed adaptive vector quantization algorithm, in this section we present the results of an experiment in which two standard images, commonly known as 'Lenna' and 'Pepper' in the literature were coded with different quality factors. Results for only the luminescence (Y) component are presented. The CC and SC code book sections, containing 128 and 2048 vectors, respectively, representing blocks of size 4×4 pixels, were trained over a database of 11 images of size 512×512. The algorithm of Y. Linde et al., "An algorithm for vector quantizer design", IEEE Trans. Commun. vol. COM-28, pp. 84–95, Jan. 1980, was used to design the code books, and seed code vectors were derived by using a pairwise nearest neighbor (PNN) algorithm over the same database of images. Average intensity of each block was removed so as to bias the code book design toward shape vectors, allowing a wide variety of images with varying background intensities to be represented by the same set of code vectors. The average intensity is estimated by those neighboring pixels which have already been decoded, as illustrated in FIG. 3, using the equation:

$$\sum_{i=1}^{9} (x_i)/9$$

This approach does not require sending of the mean intensity information, resulting in higher compression, without adversely affecting the image quality.

The original images and the decoded images at various desired quality levels were analyzed, and the results obtained are summarized in Table I when the codebooks were updated after each block. It was observed that, even for best quality, over 94% of the total number of 4×4 pixel blocks are coded by the CC code book section, and this figure increases even further as the requirement on the acceptable quality is loosened. It is further noted that the overhead of having to transmit the special flag and slightly longer SC code book section index is negligibly small. But, the improvement in S/N ratio is significant, which is about 1 dB.

TABLE I

| Quality Index* (K = D) | Bit Rate (bpp) | S/N (dB) | MSE | % times CC code book used (128 vectors) | % times SC code book used (2048 vectors) |
|---|---|---|---|---|---|
| Lenna | | | | | |
| 20 | 0.4743 | 32.41 | 37.29 | 94.65 | 5.35 |
| 71 | 0.4582 | 32.22 | 39.00 | 96.98 | 3.01 |
| 100 | 0.4440 | 31.62 | 44.71 | 99.05 | 0.94 |
| Pepper | | | | | |
| 20 | 0.4727 | 32.54 | 36.17 | 94.86 | 5.13 |
| 71 | 0.46 | 32.39 | 37.43 | 96.59 | 3.40 |
| 100 | 0.447 | 31.66 | 44.37 | 96.48 | 1.51 |

*20: Good quality; 71: medium quality; 100: poor quality

The algorithm described in this application may also be implemented to compress moving images. The compression is done in the YIQ domain with sub-sampled I and Q components. Inter-frame or intra-frame coding modes are selected as a function of motion from one frame to the next with separate YIQ code books for the two modes of coding. A fixed or variable number of vectors in the CC and SC code book sections are exchanged at regular intervals either on a sub-frame basis or on a multi-frame basis.

The invention disclosed herein has the following features and advantages. An adaptive vector quantization technique has been shown to provide flexibility in selecting the desired image quality, without the need to send the code vectors themselves. The proposed technique is a hybrid solution between fixed code book and fully adaptive vector quantization, and is specifically suited to moving images. The technique can also be advantageously applied to compress still-frame images. The significant features of the proposed algorithm are: 1) a large predesigned code book enhances coded image quality without requiring any redesign of the code book in real-time; 2) high compression is obtained by keeping only highly probable vectors in the active-space (CC section) of the code book; 3) desired image quality is maintained by utilizing the SC code book when an acceptable best match is not found in the CC code book; 4) by maintaining certain usage statistics, it is possible to update the active-space code vectors without the need to send any side information; and 5) the receiver tracks the transmitter code book entries automatically.

What is claimed is:

1. A method of compressing and reconstructing a sequence of image signals by adaptive vector quantization comprising the steps of:
    constructing a code book having a plurality of addressable entries representing combinations of elements which have appeared frequently in previously coded images;
    dividing said code book into two sections, wherein a first of said sections contains addressable entries for common characteristics of a large plurality of images, has a higher priority than a second section;
a second of said sections contains addressable entries for specific characteristics of a sequence of images, having less frequently occurring vectors and having a lower priority;
said first section containing vectors having the highest probability of occurrence;
storing said code book such that it may be used for both compression and reconstruction of the same image signals;
each of said sections being initialized to predefined sizes and states at the beginning of each coding process;
selecting a quality index which is a function of squared error distortion;
dividing each newly arriving image into blocks having N×N picture elements;
comparing each block of each newly arriving image in said sequence with entries in said first section of said code book to find a best match vector based on a distance measure;
computing a first quality measure for said block;
if said first quality measure is smaller or equal to said quality index, sending the address of said best matching vector to a receiver;
if said first quality measure is larger than said quality index, searching for a best matching vector in said second section of said code book;
computing a second quality measure for said matching vector in said second section;
if said second quality measure is larger than said first quality measure, then sending the address of said best matched vector of said first section; else sending a special flag followed by the address of said best matched vector in said second section;
maintaining a record of frequency of usage of each vector in each section of said code book;
incrementing usage records for matched vectors in said first and second sections; and
periodically reordering said code book by swapping code vectors between said sections so that the most frequently used vectors appear in said first section.

2. The method of claim 1 wherein said quality index comprises:
a user selectable quality index K, such that $$K = f(D^2) = f\left( \sum_{i=1}^{N} (x_i - y_i)^2 \right)$$

wherein $x_i$ is the $i^{th}$ component of the actual image vector, $y_i$ is the $i^{th}$ component of a vector in the code table, D is the Euclidean distance between vectors $x_i$ and $y_i$, and N is the dimension of the vectors.

3. The method of claim 1 wherein said maintaining a record of frequency of usage comprises:
providing a set of counters, one for each vector in said code book;
initializing said counters at the start of a coding process by assigning high count values to vector counters in said first section; and clearing to zero vector counters in said second section;
thereby biasing the ordering of common characteristic vectors to said first section to avoid reordering solely in response to transient characteristics.

4. A method of compressing and reconstructing image signals by vector quantization, comprising the steps of:
selecting a quality index representing the maximum distortion acceptable for a reconstructed image;
dividing two-dimensional image signals to be compressed into blocks, each block comprising a fixed number of elements;
selecting a first vector which best matches but does not exceed a maximum distortion quality index to a set of image signals in each of said blocks from a first section of a code book comprising a plurality of vectors, said code book having been prepared in advance by defining a fixed number of vector elements representing common characteristics of images previously analyzed with a high probability of occurrence;
if a match is found:
sending the address of said selected first matching vector to a receiver for reconstruction of said image using vectors from a copy of said code book;
if a match is not found:
selecting a second vector which best matches the set of image signals in each of said blocks from a second section of said code book comprising a plurality of vectors representing specific characteristics of sequences of images having a low probability of occurrence;
comparing said second matching vector with said first matching vector;
if said second matching vector has a distortion greater than that of said first matching vector, then:
sending the address of said first matching vector to receiver;
if said second matching vector has a distortion less than said first matching vector, then:
sending the address of said second matching vector to said receiver;
incrementing a counter associated with each vector address transmitted to a receiver;
comparing the values of said counters for all vectors in said first and second sections; and
interchanging periodically vectors from said first and second sections so that vectors in said first section are those most frequently accessed and those in said second section are accessed less frequently.

5. The method of claim 4 wherein said quality index comprises:
a user selectable quality index K, such that $$K = f(D^2) = f\left( \sum_{i=1}^{N} (x_i - y_i)^2 \right)$$

wherein $x_i$ is the $i^{th}$ component of the actual image vector, $y_i$ is the $i^{th}$ component of a vector in the code table, D is the Euclidean distance between vectors $x_i$ and $y_i$, and N is the dimension of the vectors.

6. The method of claim 5 further comprises:
maintaining a record of frequency of usage, comprising the steps of
providing a set of counters, one for each vector in said code book;
initializing said counters at the start of a coding process by assigning high count values to vector counters in said first section; and clearing to zero vector counters in said second section; thereby biasing the ordering of common characteristic vectors to said first section to avoid reordering solely in response to transient characteristics.

7. A system for compressing sequences of moving images at a transmitter for transmission over a network and for reconstructing said images at a receiver, comprising:
- a code book prepared in advance having two sections;
- a first section of said code book comprising a limited number of vectors representing common characteristics of an ensemble of images, said characteristics having a high probability of occurring frequently;
- a second section of said code book comprising a greater number of vectors representing specific characteristics of sequences of images, said specific characteristics occurring less frequently than said common characteristics;
- identical copies of said code book being stored in said transmitter and in said receiver;
- means to initialize said code book prior to processing a sequence of images;
- means to select a quality index wherein said quality index specifies the maximum acceptable distortion in a reconstructed image;
- means to divide each incoming image into blocks of image pixels;
- means to derive a new vector for each of said blocks;
- means to compare said new vector with stored vectors in said first section of said code book to find a first matching vector which best matches said new vector;
- means to compute a quality measure for said first matching vector;
- if said quality measure for said first matching vector indicates less distortion than said quality index, then a transmission means transmits the address of said first matching vector to said receiver as a compressed image block;
- if not, then means to compare said new vector with stored vectors in said second section of said code book to find a second vector which best matches said new vector;
- means to compute a quality measure for said second matching vector;
- means to compare the quality measure of said second matching vector with the quality measure of said first matching vector;
- if the quality measure of said second matching vector indicates a distortion greater than that of said first matching vector, then:
  - sending the address of said first matching vector to receiver as a compressed image block;
- if said second matching vector indicates a distortion less than that of said first matching vector, then:
  - sending the address of said second matching vector to said receiver as a compressed image block;
- means to retrieve vectors having said transmitter addresses at said receiver and to reconstruct an image corresponding to an original image before compression;
- means for incrementing a counter associated with each vector address transmitted to a receiver;
- means for comparing the values of said counters for all vectors in said first and second sections; and
- means for interchanging periodically vectors from said first and second sections so that vectors in said first section are those most frequently accessed and those in said second section are accessed less frequently.

8. The system of claim 7 wherein said quality index comprises:
a user selectable quality index K, such that $$K = f(D^2) = f\left( \sum_{i=1}^{N} (x_i - y_i)^2 \right)$$

wherein $x_i$ is the $i^{th}$ component of the actual image vector, $y_i$ is the $i^{th}$ component of a vector in the code table, D is the Euclidean distance between vectors $x_i$ and $y_i$, and N is the dimension of the vectors.

9. The system of claim 7 further comprises:
means for maintaining a record of frequency of usage, comprising
  means for providing a set of counters, one for each vector in said code book;
  means for initializing said counters at the start of a coding process by assigning high count values to vector counters in said first section, and clearing to zero vector counters in said second section; thereby biasing the ordering of common characteristic vectors to said first section to avoid reordering solely in response to transient characteristics.

* * * * *